US008847803B2

(12) United States Patent
Zhang et al.

(10) Patent No.: US 8,847,803 B2
(45) Date of Patent: Sep. 30, 2014

(54) PARALLEL MULTIBIT DIGITAL-TO-DIGITAL SIGMA-DELTA MODULATION

(75) Inventors: Zhongxuan Zhang, Fremont, CA (US); Bernard Ginetti, Antibes (FR)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/483,704

(22) Filed: May 30, 2012

(65) Prior Publication Data

US 2013/0063293 A1  Mar. 14, 2013

Related U.S. Application Data

(60) Provisional application No. 61/532,682, filed on Sep. 9, 2011.

(51) Int. Cl.
  *H03M 3/00* (2006.01)
  *H03M 7/30* (2006.01)

(52) U.S. Cl.
  CPC .......... *H03M 7/3002* (2013.01); *H03M 7/3004* (2013.01)
  USPC .......................................... 341/143; 341/144

(58) Field of Classification Search
  CPC ..... H03M 3/436; H03M 7/304; H03M 3/458; H03M 7/3042; H03M 3/42; H03M 7/3015; H03M 1/10; H03M 3/30; H03M 7/3004
  USPC .................................................. 341/143, 144
  See application file for complete search history.

(56) References Cited

U.S. PATENT DOCUMENTS

| | | | | |
|---|---|---|---|---|
| 6,518,905 | B2 * | 2/2003 | Siferd | 341/143 |
| 6,577,259 | B1 * | 6/2003 | Jelonnek | 341/143 |
| 6,744,392 | B2 * | 6/2004 | Melanson | 341/143 |
| 6,781,533 | B2 * | 8/2004 | Yap et al. | 341/143 |
| 7,420,485 | B2 * | 9/2008 | Neubauer et al. | 341/77 |
| 7,554,472 | B2 * | 6/2009 | Puma | 341/143 |
| 7,868,801 | B2 * | 1/2011 | Azadet et al. | 341/143 |
| 8,203,475 | B2 * | 6/2012 | Hossain et al. | 341/143 |
| 8,421,660 | B1 * | 4/2013 | Wan et al. | 341/143 |
| 2004/0041719 | A1 * | 3/2004 | Schreier | 341/144 |
| 2004/0192229 | A1 | 9/2004 | Morris et al. | |
| 2005/0231408 | A1 * | 10/2005 | Keaveney et al. | 341/143 |

OTHER PUBLICATIONS

Ionascu et al., "Design and Implementation of Video DAC in 0.1μm CMOS Technology", 2003 IEEE, pp. 381-384.
Myderrizi et al., "A High-Speed Swing Reduced Driver Suitable for Current-Steering Digital-to-Analog Converters", 2009, IEEE, pp. 635-638.
Choi et al., "Design of Oversampling Current Steering DAC With 640 MHz Equivalent Clock Frequency", 2002 IEEE, 4 pages.

* cited by examiner

*Primary Examiner* — Linh Nguyen
(74) *Attorney, Agent, or Firm* — Edell, Shapiro & Finnan, LLC

(57) ABSTRACT

Digital input words are received in parallel by a parallel digital-to-digital sigma-delta modulator. Error words corresponding to quantization error are added in parallel to the input words to form encoded data words. The encoded data words are quantized into parallel output words and the error words resulting from such quantization are distributed across parallel modulator stages to effect a predetermined quantization error spectral distribution. The quantized output words are output in parallel.

20 Claims, 7 Drawing Sheets

PARALLEL MULTIBIT DIGITAL-TO-DIGITAL SIGMA-DELTA MODULATION

RELATED APPLICATION DATA

This patent application claims benefit of U.S. Provisional Patent Application 61/532,682 entitled, "Parallel Feeding of Data to High Speed Multi-bit Sigma-Delta DAC," filed on Sep. 9, 2011, the entire disclosure of which is incorporated herein by reference.

TECHNICAL FIELD

The present disclosure relates to digital modulation of signals.

BACKGROUND

Sigma-Delta modulators (SDMs) have been increasingly popular in digital-to-analog conversion devices (DACs), particularly in light of improvements in modern complementary metal-oxide semiconductor (CMOS) processes. Sigma-Delta (SD) modulation trades accuracy for speed and removes quantization noise from the signal band through oversampling and noise shaping. Current design trends are towards ever higher sampling rates and reducing DAC resolution to the smallest possible value. The analog circuitry of the DAC can be kept very simple owing to the reduced resolution, and the use of fewer and larger unit devices with better matching can be achieved in full custom handcrafted circuit layouts. In the digital circuitry of a SDM DAC, timing issues associated with decoders, local resynchronization, etc., are ameliorated by the use of a small number of unit devices, by shared/unique clock buffers and by signal propagation over very short lines. Tiled circuit layout can minimize skew between clock and data over the entire design.

Issues in the SDM itself, which bears the burden of generating low-resolution data at a high sampling rate, are not so readily resolved. When an SDM is fed full resolution data at a high data conversion sampling rate, the SDM must process data at a much higher data rate in terms of bits/second than the analog portion of the DAC. Mathematical operations, even if usually very simple, such as addition or multiplication with few bit coefficients, that have to be carried out prior to quantization result in prohibitively long critical path delays, even when adder architectures are optimized for speed. The overall complexity of the digital circuitry and the complex circuit patterns thereof, especially with fast adder architectures are needed for speed concerns, make it totally unsuitable for handcrafted full custom regular tiled layout (as is used for the analog circuitry). Regular digital design flow Electronic Design Automation (EDA) tools, e.g., physical synthesis and automatic placed and route, typically fail to implement the digital logic when clock frequencies are on the order of a gigahertz, even if such speed is feasible and easily achievable part in deep submicron processes in the analog circuitry.

SUMMARY

A parallel digital-to-digital sigma-delta modulator includes a plurality of parallel modulator stages. Each modulator stage includes an input bus, to accept an input data word in parallel with such input on input buses of remaining parallel modulator stages, and an output bus to output an output data word in parallel with such output on output buses of remaining parallel modulator stages. Each modulator stage further includes a processing circuit that is communicatively coupled to the input bus and that accepts the input data word therefrom. The processing circuit is coupled as well to the output bus to provide the output data word thereon. The sigma-delta modulator includes a feedback distribution bus to distribute the error word produced by each processing circuit across the modulator stages to effect a specified quantization noise spectral distribution.

DESCRIPTION OF EXAMPLE EMBODIMENTS

Figure 1:
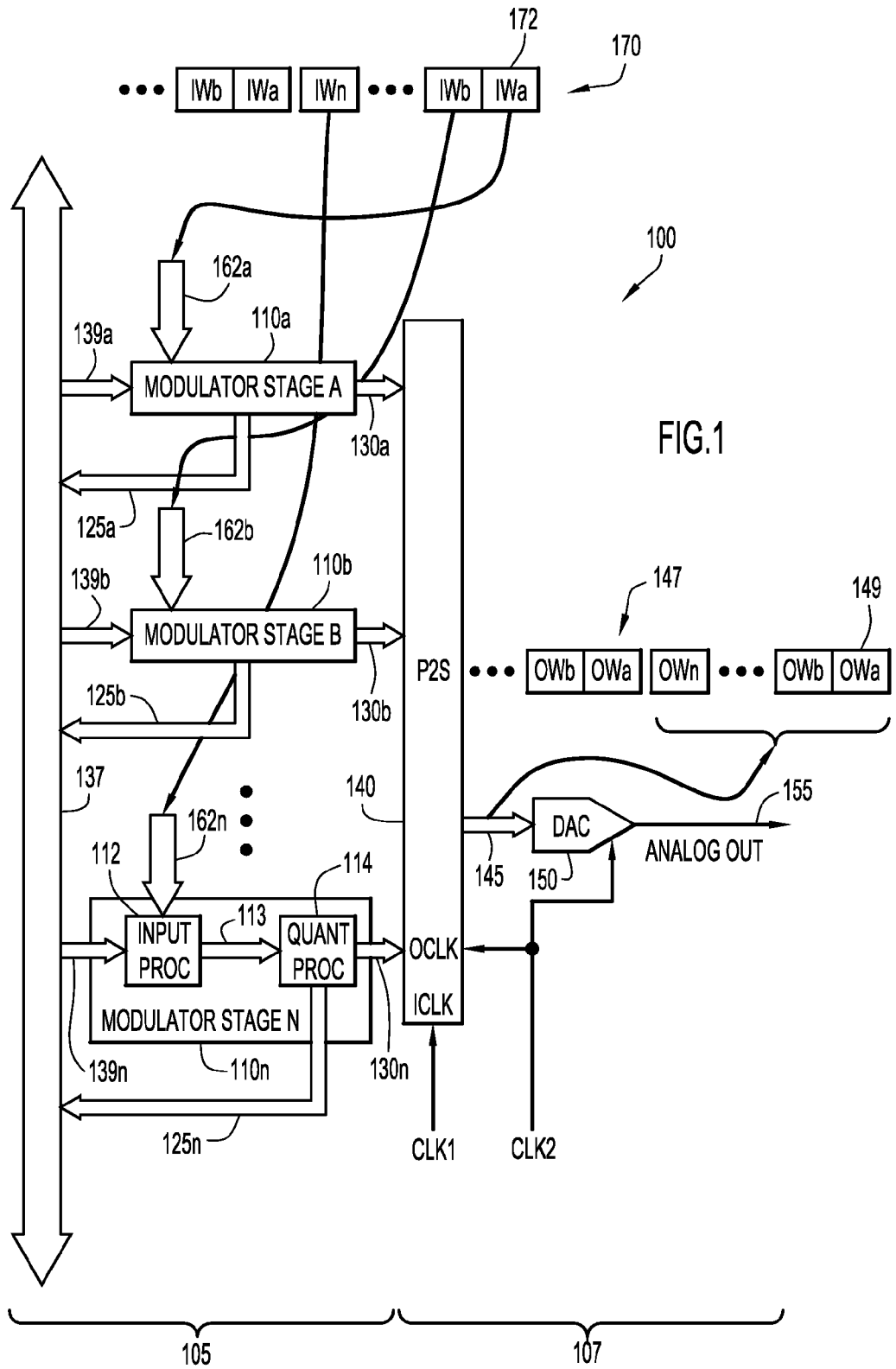
FIG. 1 is a schematic block diagram of a parallel processing architecture by which parallel multibit digital-to-digital sigma-delta modulation may be embodied.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, mathematical expressions are contained herein and those principles conveyed thereby are to be taken as being thoroughly described thereby. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

FIG. 1 is a schematic block diagram of a signal converter 100 including an example parallel digital-to-digital SDM 105, or simply SDM 105, by which the present invention may be embodied. SDM 105 comprises a plurality of modulator stages 110a-110n, representatively referred to herein as modulator stage(s) 110, interconnected one to another and to external circuitry through a plurality of conductors, or buses. It is to be understood that the connectivity illustrated and described with reference to FIG. 1 may be achieved through numerous conductor configurations; the various buses illustrated and described are for purposes of explanation and not limitation. It is to be understood as well that the present invention is not limited to the number of modulator stages 110, as will be recognized by the ordinarily skilled artisan upon review of this disclosure.

Each modulator stage may implement a processing circuit including an input processor 112 to process input data conveyed thereto on input buses 162a-162n, representatively referred to herein as input bus(es) 162 and data conveyed thereto on feedback buses 139a-139n, representatively referred to herein as feedback bus(es) 139. The processing circuit of each modulator stage 110 may further include a quantization processor 114 coupled to the input processor via a forward processing bus 113.

As illustrated in FIG. 1, a digital input data stream 170 comprises a series of digital input data words 172, or simply input words 172. Input words 172 may be provided in parallel to the input processors 112 of respective modulator stages 110 through respective input buses 162. In the arrangement of FIG. 1, the temporally-earliest input word 172 in input stream 170 is provided to modulator stage 110a and the temporally-latest input word in input stream 170 is provided to modulator stage 110n, although the present invention is not so limited. At input processor 112, input data words 172 are encoded by feedback data conveyed over feedback distribution bus 137 and provided to input processors 112 by respective feedback buses 139. The processed data words, referred to herein as forward processing data words, or simply forward words, are provided to quantization processor 114 over forward processing bus 113. The forward words are quantized by quantization processor 114 in each modulator stage 110 to generate SD modulated output data words 149, or simply output words 149. The output words 149 contain fewer bits, i.e., lower resolution data and are conveyed in parallel on respective output buses 130a-130n, representatively referred to herein as output bus(es) 130. The error resulting from the quantization is carried in quantization error words, or simply error words, which are conveyed from quantization processor 114 over respective quantization error buses 125a-125n, representatively referred to herein as quantization error bus(es) 125, or simply error bus(es) 125, to feedback distribution bus 137. Feedback distribution bus 137 distributes the error words across the modulator stages 110 so as to achieve SD modulation of all input words 172 in a given clock cycle such that the quantization error resulting from such quantization is spectrally distributed over the output words 149 in a prescribed way.

SD modulated output data may be provided to output circuit 107, representatively illustrated by a parallel-to-serial converter (P2S) 140, a serial digital data bus 145 and a DAC 150. P2S 140 serializes the output words on output buses 130 onto serial digital data bus 145 as a serial output stream 147. Serial output stream 147 may be provided to DAC 150, which converts the SD modulated output words into an analog output signal 155. It is to be understood that the present invention is not limited to the functionality of output circuit 107, as will be recognized by the ordinarily skilled artisan upon review of this disclosure.

As illustrated in FIG. 1, the sample rate of DAC 150 is established by a clock signal CLK2, while SDM 105 operates at a frequency established by clock signal CLK1. When so embodied, N input words 172 may be processed in parallel by SDM 105 in a period of CLK1 and serialized into data stream 147 in N periods of CLK2. When CLK1 is set to CLK2/N, SDM 105 has N times longer processing time in which to perform the digital modulation operations.

Figure 2:
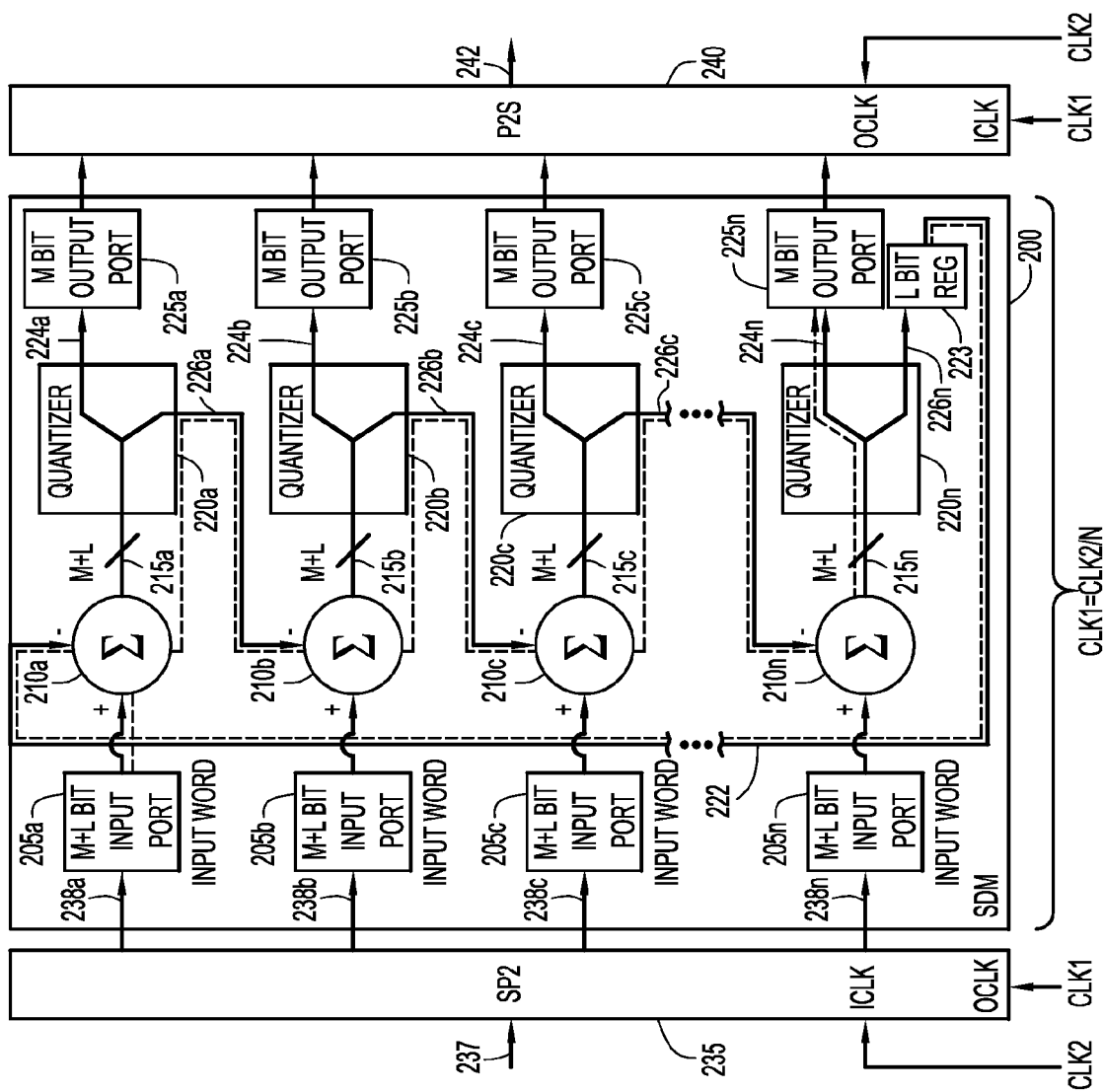
FIG. 2 is a schematic block diagram of a parallel multibit first order digital-to-digital sigma-delta modulator.

An exemplary N× (N-times)-parallel first-order SDM 200 is illustrated in FIG. 2. As used herein, the order of the SD modulation refers to the number of input samples on which the error word of a single modulation stage is applied. An input digital data stream 237 may be provided to a serial-to-parallel converter (S2P) 235 and N samples 238a-238n, representatively referred to herein as input sample(s) 238, are provided in parallel, either directly or through interposing circuitry, to respective input ports 205a-205n, representatively referred to herein as input port(s) 205. Input ports 205 may be implemented by, for example, a direct bus connection, an input register, etc.; the present invention is not limited any particular type or function of input port 205. However, when embodied as registers, it is to be understood that input data words are loaded in those registers at the reduced clock rate of CLK1.

In certain embodiments, input stream 237 is an N-times upsampled version of an original signal (not illustrated). Such upsampling realizes noise-spreading, as is typical for SD modulation.

Input words 238 are forwarded from input ports 205 to respective input processors, which, in the case of SDM 200, comprise adders 210a-210n, representatively referred to herein as adder(s) 210. From adders 210, encoded input words are forwarded to quantizers 220a-220n, representatively referred to herein as quantizer(s) 220 over forward data processing buses 215a-215n, representatively referred to herein as forward data processing bus(es) 215. Quantizers 220 reduce the word size, and correspondingly, the resolution of the output data. The quantization error resulting from the resolution reduction is conveyed as error words over error buses 226a-226n, representatively referred to herein as error bus(es) 226, to other modulation stages. In that SDM 200 is a first-order SDM, the error word from the quantizer of one modulator stage, for example, quantizer 220b, is conveyed to the input circuit of an adjacent stage, i.e., adder 210c and the error word of quantizer 225c is conveyed to the adder of quantizer 225d (not illustrated), and so on. The error word of quantizer 220n is stored in register 223 and conveyed to adder 210a over bus 222, where it is added to the subsequent input word provided through input port 205a. The quantized output words of quantizers 220 are forwarded to respective output ports 225a-225n, representatively referred to herein as output port(s) 225. Output ports 225 may be of similar construction as input ports 205 and the present invention is not limited to a particular implementation thereof.

Output ports 225 may be coupled, either directly or through interposing circuitry, to P2S 240 through which the output data are serialized into output stream 242. As illustrated in FIG. 2, the input data stream 237 is clocked into S2P 235 at a clock rate CLK2 and output from S2P 235 as parallel data at a clock rate CLK1=CLK2/N. P2S 240 operates in complementary fashion, clocking parallel data from output ports 225 at clock rate CLK1 and providing output words in serial stream 242 at a clock rate CLK2. Accordingly, the logical operations performed by SDM 200 may be performed at a lower clock rate, as described above.

As illustrated in FIG. 2, input words 238 are M+L bits wide, where M is a number of most-significant bits of input word 238 and L is the number of remaining least-significant bits. Quantizer 220 forwards the MSB, i.e., the M most-significant bits of forward word 215, to output port 225 and forwards the LSB, i.e., the L least significant bits of forward word 215, to adjacent modulator stages as error words on error buses 226. Accordingly, quantizer 220 may be implemented by a suitable bus structure, whereby the conductors carrying the MSB connect adder 210 to the output port 225 of the same modulator stage, and the conductors carrying the LSB connect the adder 210 to the adder 210 of the adjacent modulator stage, as is illustrated in FIG. 2.

The critical path of SDM 200, i.e., the longest interdependent processing path through SDM 200 for complete SD modulation of N input words, is representatively illustrated by the dashed critical path line 250. As is illustrated in FIG. 2, critical path 250 includes N L-bit additions in adders 210a-210n, and one M-bit addition in adder 210a. As a bit settles in an upper adder, adder 210a for example, it is immediately propagated to the next lower adder 210b, then to adder 210c, and so on to adder 210n. That is, all additions can be performed concurrently, at least with respect to a period of CLK1. For purposes of analysis, it is to be assumed that adders 210 are of slow adder architecture, such as a ripple carry adder where output bits progressively settle from least significant bit to most significant bit. In such an implementation, the total adder delay is proportional to resolution, i.e., the number of bits times the duration of a one (1)-bit adder delay. A traditional non-parallel SDM implementation would require a critical path characterized by M+L adder delays, which must be no greater than one DAC sampling period, $t_s$. The critical path of a two times (2×) parallel implementation is characterized by M+L+1 adder delays, to be no greater than $2 \cdot t_s$. An N× parallel implementation, such as SDM 200, would have a critical path characterized by M+L+N−1 adder delays, to be no greater than $N \cdot t_s$. The time budget for adding two (2) one (1)-bit samples is equal to $N \cdot t_s/(M+L+N-1)$. Numerically, considering a 16-bit input resolution and a one (1) ns sampling period $t_s$, a non-parallel implementation requires adder delay to be no greater than approximately 60 ps. On the other hand, a 16× parallel implementation relaxes that requirement to about 500 ps.

Figure 3:
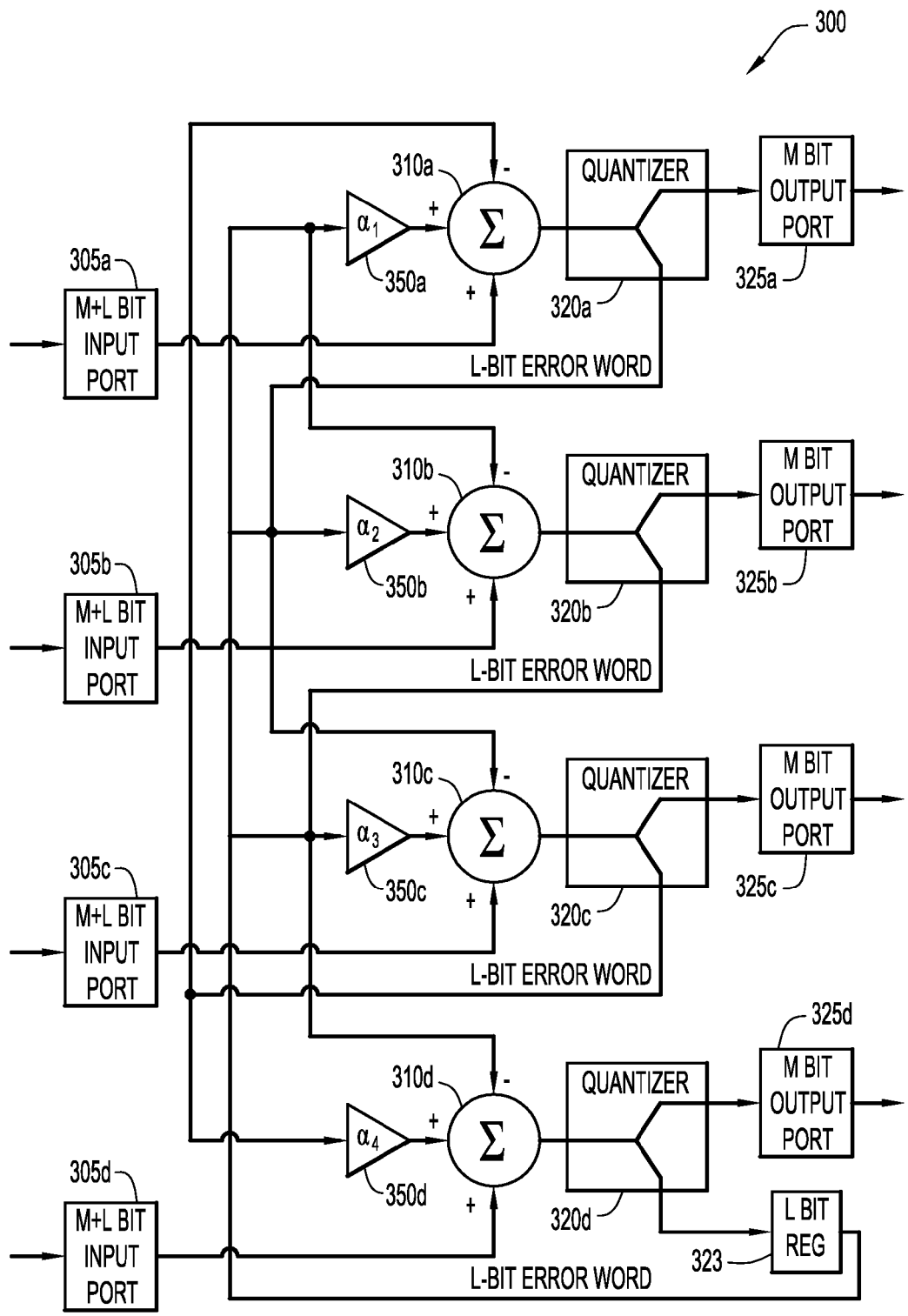
FIG. 3 is a schematic block diagram of a parallel multibit second order digital-to-digital sigma-delta modulator with noise-shaping multipliers.

A 4× parallel second-order SDM 300 is illustrated in FIG. 3. SDM 300 may be constructed with components similar to SDM 200, i.e., input ports 305a-305d, adders 310a-310d, quantizers 320a-320d, output ports 325a-325d, and register 323 may be implemented in similar fashion as their respective counterparts in SDM 200. As such, the description of these similar components will be omitted for conciseness. The input processors of SDM 300 include multipliers 350a-350d, representatively referred to herein as multiplier(s) 350, and one or more adders that implement three term adders 310a-310d, representatively referred to herein as adders 310.

Figure 4:
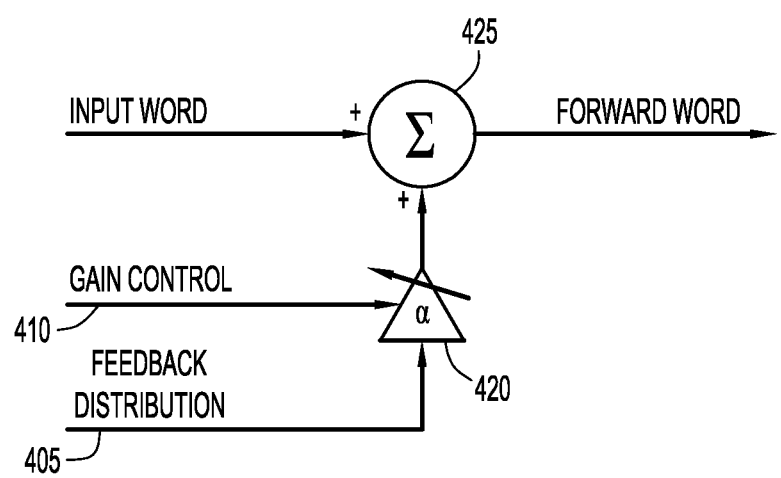
FIG. 4 is a schematic block diagram of a variable gain multiplier by which a programmable noise transfer function of a parallel multibit digital-to-digital sigma-delta modulator is achieved.

SDM 300 is a second order SDM and, as such, the error word of one modulator stage, e.g., that from quantizer 320a, for example, is distributed to the input processors of two other modulator stages, e.g., the multiplier 350b of the nearest adjacent stage and the adder 310c of the next nearest adjacent modulator stage. The error word of quantizer 320c is conveyed to the multiplier of the nearest adjacent stage, i.e., multiplier 350d and to the adder of the next nearest stage, which is adder 310a. Similarly, the error word from quantizer 320d is conveyed to multiplier 350a and to adder 310b. Without multipliers 350, second-order SDM 300 will typically have lower quantization noise in the signal band than first-order SDM 200. Multipliers 350 may be used to modify the quantization noise spectrum in a prescribed way. By way of example, a variable gain multiplier 420, as illustrated in FIG. 4, may be inserted into SDM 300 at the locations of multipliers 350. The multiplicative value, or gain a, may be modified in accordance with a gain control signal 410. The error word is provided to multiplier 420 through feedback distribution bus 405. When so embodied, the Noise Transfer Function (NTF) of SDM 300 is given by:

$$NTF = \frac{OUT(z)}{N(z)}\bigg|_{IN(z)=0} = 1 - \alpha z^{-1} + z^{-2} = \frac{z^2 - \alpha z + 1}{z^2}. \quad (1)$$

Complex conjugate zeros of this NTF occur at a normalized frequency $f_0$ by the relationship:

$$\alpha = 2\cos(2\pi f_0), \quad (2)$$

where $f_0$ is the selected frequency normalized to the sampling frequency, i.e., $F/F_{CLK2}$, where F is the frequency selected through gain control 410. Equation 2 may be rewritten as:

$$\alpha = 2\cos\left(2\pi \frac{F}{F_{CLK2}}\right). \quad (3)$$

Figure 5:
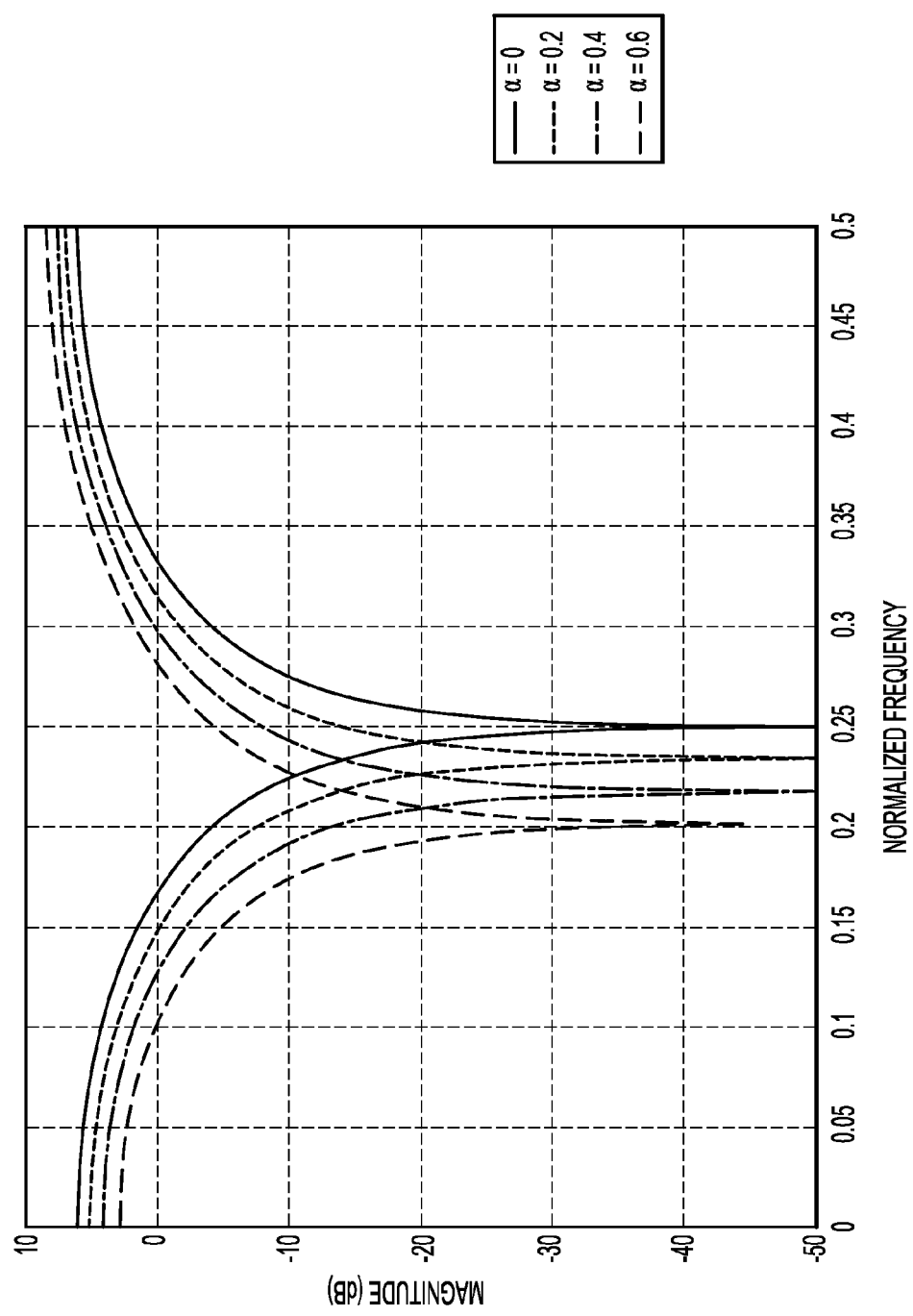
FIG. 5 is a graph illustrating the noise transfer function of the parallel multibit second order digital-to-digital sigma-delta modulator illustrated in FIG. 3 for different values of multiplicative gain.

In one embodiment, spectra of the NTF of Equation 1 for various values of a are illustrated in FIG. 5. As illustrated, the spectral null of the NTF is programmable, i.e., is located by prudent selection of the gain a. The ordinarily skilled artisan will readily appreciate that similar analysis can be performed to arrive at a set of fixed gains a that can be assigned to respective multipliers 350 to achieve a desired spectral distribution of quantization error noise.

Figure 6:
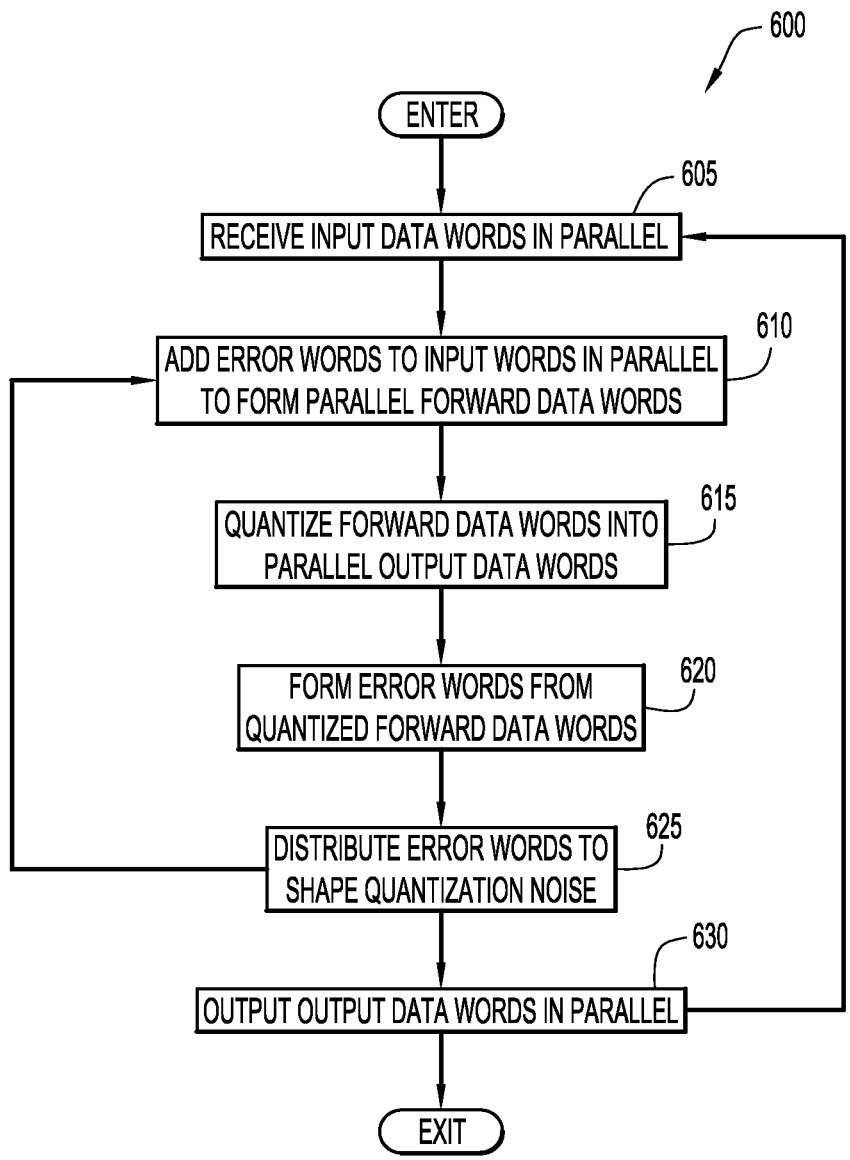
FIG. 6 is a flow diagram of a parallel multibit digital-to-digital sigma-delta modulation process.

An embodied parallel SD modulation process 600 is illustrated in FIG. 6. In operation 605, input words are received in parallel and error words are added thereto in operation 610 to form forward words. The forward words are quantized into parallel output words in operation 615 and error words are formed from the forward words in operation 620. In operation 625, the error words are distributed across parallel addition processes of operation 610. The quantized output words are output in parallel in operation 630 and process 600 may be repeated at operation 605, where a new set of input words are received.

Figure 7:
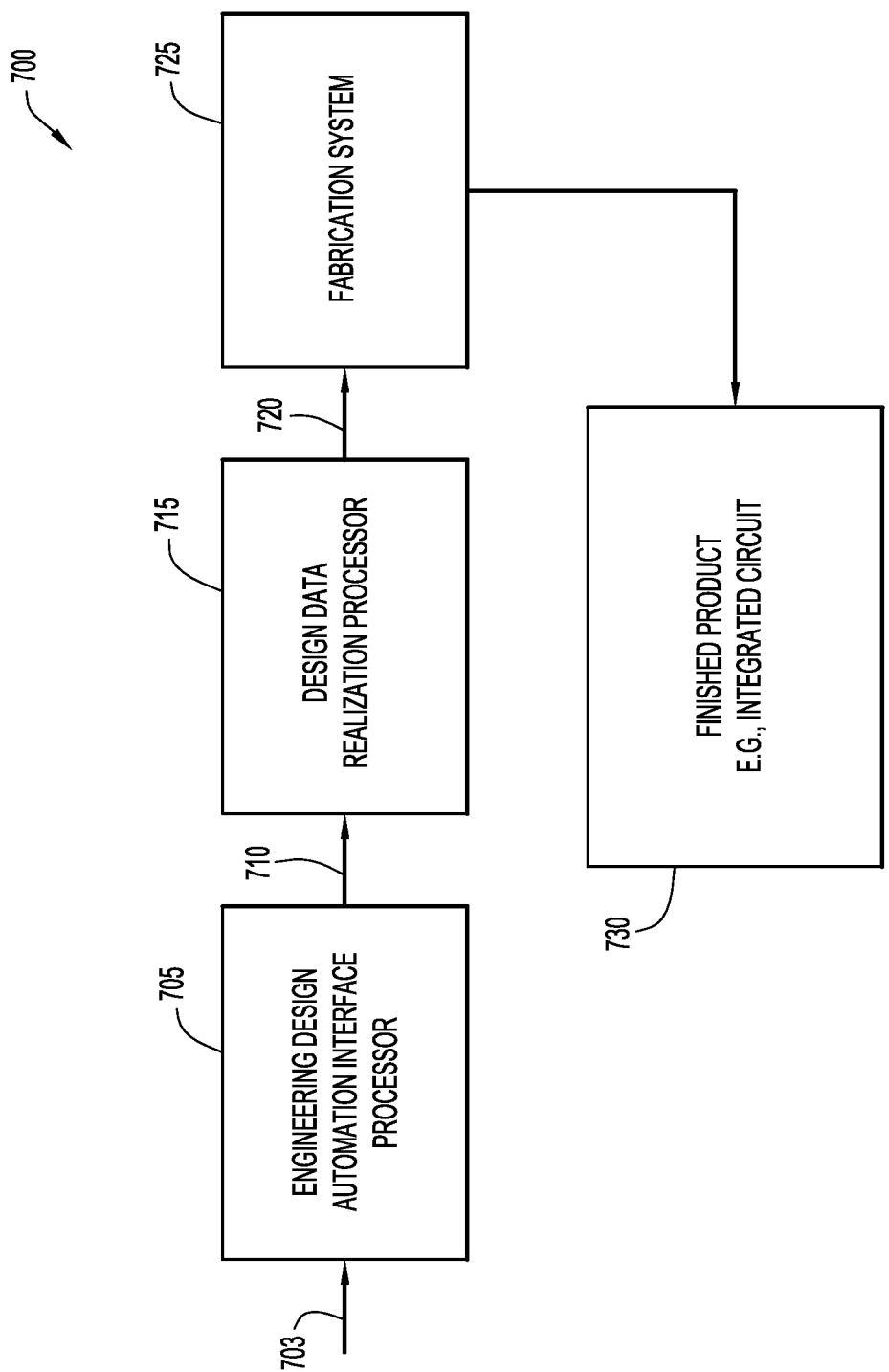
FIG. 7 is a block diagram of a circuit design and fabrication process by which a parallel multibit digital-to-digital sigma-delta modulator circuit may be fabricated.

Certain embodiments of the present invention provide for the functional components to be manufactured, transported, marketed and/or sold as processor instructions encoded on non-transitory computer-readable media. For example, as illustrated in FIG. 7, one such computer-readable medium (not illustrated) may be provided to a circuit fabrication process 700 carrying processor instructions 703 that, when executed by an Electronic Design Automation (EDA) interface processor 705, a graphical representation of an embodiment of the present invention is presented to a user, such as on a display device (not illustrated). Through EDA interface 705, a circuit designer may incorporate the present invention into a larger circuit design. Once a circuit design has been completed, another non-transitory computer-readable medium (not illustrated) carrying other processor instructions 710, such as a hardware description language, may be provided to a design data realization processor 715. The design data realization processor 715 may convert the instructions 710 provided thereto into another set of processor instructions 720, by which a tangible circuit, e.g., integrated circuit 730, may be realized when executed by a circuit fabrication system 725. Such realization data 720 may include data to construct component and interconnect mask patterns, component placement location data, packaging data, and any other data necessary in a fabrication process to produce the finished circuit product 730. Other realization data 720 may include milling machine instructions and wiring instruction data, where the specific form of the realization data 720 is dependent on the type of circuit 730 in which the present invention is embodied.

Processor instructions 703, 710 and 720 may be encoded on non-transitory computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions 703, 710 and 720, as well as processor instructions that implement process 600 in FIG. 6, may be encoded and then subsequently retrieved, decoded and executed by a processor, where such media includes electrical, magnetic and optical storage devices. Examples of non-transitory computer-readable media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present invention as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An apparatus comprising:
   a plurality of modulator stages configured to produce a plurality of output data words of a resolution-reduced serial output digital data stream through quantization and quantization noise spectral distribution of a plurality of input data words obtained from a serial input digital data stream, the modulator stages being configured as a linear array arranged in a temporal sequence order common to that in which the input data words are obtained from the input digital data stream, the modulator stages being configured further to accept the input data words and to provide the output data words in corresponding parallel data transfer operations, each modulator stage comprising:
      an input bus constructed to accept an input data word at a position among the parallel input data words that corresponds with the position in the temporal sequence order of the modulator stage;
      an output bus constructed to output an output data word at the position among the parallel output data words that corresponds with the position in the temporal sequence order of the modulator stage; and
      a processing circuit communicatively interposed between the input bus and the output bus and configured to process the input data word with one or more feedback words in accordance with a specified quantization noise spectral distribution to produce the output data word and an error word; and
   a feedback distribution bus communicatively coupled across the modulator stages and constructed to convey the error word produced by the processing circuit in each of the modulator stages to one or more of the modulator stages at other positions in the temporal sequence order whereat the error word is utilized as one of the feedback words to effect the specified quantization noise spectral distribution.

2. The apparatus of claim 1, wherein the processing circuit of each of the modulator stages comprises:
   an input processor communicatively coupled to the input bus and to the feedback distribution bus, the input processor being configured to modulate the input data word received on the input bus by the one or more feedback words received on the feedback distribution bus; and
   a quantization processor communicatively coupled to the input processor, the feedback distribution bus and the output bus, the quantization processor being configured to quantize the modulated input word received from the input processor and to provide the resulting output word to the output bus and the resulting error word to the feedback distribution bus.

3. The apparatus of claim 2, wherein the feedback distribution bus interconnects the quantization processor in the modulator stage at each position in the temporal sequence order of the modulator stages to the input processor in the modulator stage at one or more other positions in the temporal sequence order of the modulator stages in accordance with a temporal quantization error distribution that establishes the spectral distribution of the quantization noise.

4. The apparatus of claim 3, wherein the feedback distribution bus conveys the error word produced by the quantization processor in the modulator stage that is latest in the temporal sequence order to the input processor in the modulator stage that is earliest in the temporal sequence order.

5. The apparatus of claim 4, wherein each of the modulator stages comprises:
   a forward data bus having a number of conductors equal to the word width of the input data word and connected to the input processor to convey the modulated input data word thereon;
   wherein the quantization processor connects a number of the conductors of the forward data bus equal to the word width of the output data word to the output bus so as to convey the output data words thereon and connects the remaining conductors of the forward data bus to the feedback distribution bus so as to convey the error word thereon.

6. The apparatus of claim 5, wherein the feedback distribution bus connects the quantization processor in the modulator stage at each position in the temporal sequence order to the input processor in the modulator stage at more than one other position in the temporal sequence order.

7. The apparatus of claim 6, wherein the input processor comprises an adder to add the feedback word conveyed thereto via the feedback distribution bus to the input word conveyed thereto via the input bus.

8. The apparatus of claim 7, wherein the input processor of at least one of the modulator stages comprises a multiplier, the multiplier having an output that is connected to the adder of the input processor of at least one other of the modulation stages.

9. The apparatus of claim 8, wherein the output of the multiplier is variably controlled by a signal provided thereto by which to modify the spectral distribution of the quantization noise.

10. A method comprising:
   receiving a plurality of input data words in parallel one with the others and in a temporal sequence order common with that of a digital data stream from which the input data words were obtained;

processing the parallel input data words with respective feedback words in parallel processing operations associated with respective positions in the temporal sequence order to produce respective parallel forward data words;

quantizing the forward data words in parallel quantization operations associated with the respective positions in the temporal sequence order to produce respective parallel output data words and associated error words representing quantization errors in the respective output data words;

distributing the error words produced by the quantization operations associated with the respective positions in the temporal sequence order to the processing operations associated with other positions in the temporal sequence order whereat the error words are utilized as the feedback words to shape quantization noise generated by the quantization operations over the parallel output data words to a predetermined spectral distribution; and outputting the output data words in parallel one with the others and in the temporal sequence order.

11. The method of claim 10, wherein quantizing the forward data words comprises assembling a number of bits separated from each forward data word as the output data word and assembling the remaining bits of each forward data word as the error word.

12. The method of claim 11, wherein processing the input data words comprises adding the feedback words provided through the distributing to the input data words.

13. The method of claim 12, wherein processing the input data words further comprises:
multiplying the feedback words originating from the respective quantization operations associated with the respective positions in the temporal sequence order by a multiplier; and
adding the multiplied feedback words to the respective input data words the processing operations associated with other positions in the temporal sequence order.

14. A tangible non-transient computer-readable medium that, when executed by a processor, generates data that, when provided to an electronic circuit production apparatus, constructs a circuit comprising:
a plurality of parallel modulator stages configured to produce a plurality of output data words of a resolution-reduced serial output digital data stream through quantization and quantization noise spectral distribution of a plurality of input data words obtained from a serial input digital data stream, the modulator stages being configured as a linear array arranged in a temporal sequence order common to that in which the input data words are obtained from the input digital data stream, the modulator stages being configured further to accept the input data words and to provide the output data words in corresponding parallel data transfer operations, each modulator stage comprising:
an input bus constructed to accept an input data word at a position among the parallel input data words that corresponds with the position in the temporal sequence order of the modulator stage;
an output bus constructed to output an output data word at the position among the parallel output data words that corresponds with the position in the temporal sequence order of the modulator stage; and
a processing circuit communicatively interposed between the input bus and the output bus and configured to process the input data word with one or more feedback words in accordance with a specified quantization noise spectral distribution to produce the output data word and an error word; and
a feedback distribution bus communicatively coupled across the modulator stages and constructed to convey the error word produced by the processing circuit in each of the modulator stages to one or more of the modulator stages at other positions in the temporal sequence order whereat the error word is utilized as one of the feedback words to effect the specified quantization noise spectral distribution.

15. The tangible non-transient computer-readable medium of claim 14, wherein the circuit comprises:
an input processor communicatively coupled to the input bus and to the feedback distribution bus, the input processor being configured to modulate the input data word received on the input bus by the one or more feedback words received on the feedback distribution bus; and
a quantization processor communicatively coupled to the input processor, the feedback distribution bus and the output bus, the quantization processor being configured to quantize the modulated input word received from the input processor and to provide the resulting output data word to the output bus and the resulting error word to the feedback distribution bus.

16. The tangible non-transient computer-readable medium of claim 15, wherein the feedback distribution bus interconnects the quantization processor in the modulator stage at each position in the temporal sequence order of the modulator stages to the input processor in the modulator stage at one or more other positions in the temporal sequence order of the modulator stages in accordance with a temporal quantization error distribution that establishes the spectral distribution of the quantization noise, the feedback bus being configured to convey the error word produced by the quantization processor in the modulator stage stages that is latest in the temporal sequence order to the input processor in the of the modulator stage that is earliest in the temporal sequence order.

17. The tangible non-transient computer-readable medium of claim 16, wherein the circuit comprises:
a forward data bus having a number of conductors equal to the word width of the input data word and connected to the input processor to convey the modulated input data word thereon; wherein the quantization processor is configured to connect a number of the conductors of the forward data bus equal to the word width of the output data word to the output bus so as to convey the output data words thereon and connects the remaining conductors of the forward data bus to the feedback distribution bus so as to convey the error word thereon.

18. The tangible non-transient computer-readable medium of claim 17, wherein the feedback distribution bus connects the quantization processor in the modulator stage at each position in the temporal sequence order to the input processor in the modulator stage at more than one other position in the temporal sequence order; and
the circuit comprises an adder in the input processor to add the feedback word conveyed thereto via the feedback distribution bus to the input word conveyed thereto on the input bus.

19. The tangible non-transient computer-readable medium of claim 18 wherein the circuit comprises:
a multiplier in the input processor of at least one of the modulation stages, the multiplier having an output that is connected to the adder of the input processor of at least one other of the modulator stages.

20. The tangible non-transient computer-readable medium of claim 18, wherein the circuit comprises:

a programmable multiplier as the multiplier, the output of which being variably controlled by a signal provided thereto by which to modify the spectral distribution of the quantization noise.

\* \* \* \* \*